US008552813B2

(12) United States Patent
Gritters et al.

(10) Patent No.: US 8,552,813 B2
(45) Date of Patent: Oct. 8, 2013

(54) HIGH FREQUENCY, HIGH BANDWIDTH, LOW LOSS MICROSTRIP TO WAVEGUIDE TRANSITION

(75) Inventors: Darin M. Gritters, Yucaipa, CA (US); Kenneth W. Brown, Yucaipa, CA (US); Andrew K. Brown, Hesperia, CA (US); Michael A. Moore, Fort Worth, TX (US); Patrick J. Kocurek, Allen, TX (US); Thomas A. Hanft, Allen, TX (US)

(73) Assignee: Raytheon Company, Waltham, MA (US)

(*) Notice: Subject to any disclaimer, the term of this patent is extended or adjusted under 35 U.S.C. 154(b) by 166 days.

(21) Appl. No.: 13/303,823

(22) Filed: Nov. 23, 2011

(65) Prior Publication Data

US 2013/0127563 A1 May 23, 2013

(51) Int. Cl.
*H03H 5/00* (2006.01)

(52) U.S. Cl.
USPC ............................................... 333/26; 333/34

(58) Field of Classification Search
USPC ........................................................... 333/26
See application file for complete search history.

(56) References Cited

U.S. PATENT DOCUMENTS

| | | | |
|---|---|---|---|
| 3,818,386 | A | 6/1974 | Granberry |
| 3,969,691 | A | 7/1976 | Saul |
| 4,260,964 | A | 4/1981 | Saul |
| 4,500,887 | A | 2/1985 | Nester |
| 4,550,296 | A | 10/1985 | Ehrlinger et al. |
| 4,641,107 | A | 2/1987 | Kalokitis |
| 4,651,115 | A | 3/1987 | Wu |
| 5,202,648 | A | 4/1993 | McCandless |
| 5,218,322 | A | 6/1993 | Allison et al. |
| 5,481,223 | A | 1/1996 | Wong |
| 5,515,009 | A | 5/1996 | Wong et al. |
| 5,600,286 | A | 2/1997 | Livingston et al. |
| 5,736,908 | A | 4/1998 | Alexanian et al. |

(Continued)

FOREIGN PATENT DOCUMENTS

| | | |
|---|---|---|
| EP | 0 653 801 A1 | 5/1995 |
| EP | 0 448 318 B1 | 5/1996 |

(Continued)

OTHER PUBLICATIONS

Office Action dated Aug. 10, 2011; for U.S. Appl. No. 12/371,857; 5 pages.

(Continued)

*Primary Examiner* — Robert Pascal
*Assistant Examiner* — Kimberly Glenn
(74) *Attorney, Agent, or Firm* — Daly, Crowley, Mofford & Durkee, LLP

(57) ABSTRACT

Embodiments of the invention are directed toward a novel printed antenna that provides a low-loss transition into waveguide. The antenna is integrated with a heat spreader and the interconnection between the antenna and the output device (such as a power amplifier) is a simple conductive connection, such as (but not limited to), a wirebond. Integrating the antenna with the heat spreader in accordance with the concepts, circuits, and techniques described herein drastically shortens the distance from the output device to the waveguide, thus reducing losses and increasing bandwidth. The transition and technique described herein may be easily scaled for both higher and lower frequencies. Embodiments of the present apparatus also eliminate the complexity of the prior art circuit boards and transitions and enable the use of a wider range of substrates while greatly simplifying assembly.

26 Claims, 5 Drawing Sheets

(56) References Cited

U.S. PATENT DOCUMENTS

| | | | |
|---|---|---|---|
| 5,920,240 A | 7/1999 | Alexanian et al. | |
| 6,043,785 A | 3/2000 | Marino | |
| 6,130,640 A | 10/2000 | Uematsu et al. | |
| 6,144,266 A | 11/2000 | Heidemann et al. | |
| 6,188,373 B1 | 2/2001 | Martek | |
| 6,239,764 B1 | 5/2001 | Timofeev et al. | |
| 6,509,809 B1 | 1/2003 | Lynch | |
| 6,525,650 B1 | 2/2003 | Chan et al. | |
| 6,542,662 B2 | 4/2003 | Cheung et al. | |
| 6,559,724 B2 | 5/2003 | Rosenberg et al. | |
| 6,639,486 B2 | 10/2003 | Buck | |
| 6,765,535 B1 | 7/2004 | Brown et al. | |
| 6,876,272 B2 | 4/2005 | DeLisio, Jr. et al. | |
| 6,967,624 B1 | 11/2005 | Hsu et al. | |
| 7,088,300 B2 | 8/2006 | Fisher | |
| 7,215,220 B1 | 5/2007 | Jia | |
| 7,382,212 B2 | 6/2008 | Lo Hine Tong et al. | |
| 7,391,283 B2 | 6/2008 | Kearns | |
| 7,511,664 B1 | 3/2009 | Mason et al. | |
| 7,839,350 B2 | 11/2010 | Nagai | |
| 8,305,280 B2 * | 11/2012 | Brown et al. | 343/767 |
| 2003/0042993 A1 | 3/2003 | Sayanagi et al. | |
| 2004/0212537 A1 | 10/2004 | Mohammadian | |
| 2006/0077102 A1 | 4/2006 | Mohamadi | |
| 2006/0202777 A1 | 9/2006 | Deckman et al. | |
| 2006/0203757 A1 | 9/2006 | Young et al. | |
| 2010/0072829 A1 | 3/2010 | Mason et al. | |
| 2010/0210225 A1 | 8/2010 | Lowell et al. | |
| 2011/0102284 A1 | 5/2011 | Brown et al. | |

FOREIGN PATENT DOCUMENTS

| | | |
|---|---|---|
| EP | 0 905 814 A2 | 8/1999 |
| EP | 1 151 317 B1 | 3/2005 |
| EP | 1 301 966 B1 | 8/2005 |
| GB | 2 225 170 A | 5/1990 |
| JP | 8-139504 A | 5/1996 |
| JP | 2002-208806 A | 7/2002 |
| WO | WO 2010/019355 A1 | 2/2010 |
| WO | WO 2011/056287 A1 | 5/2011 |

OTHER PUBLICATIONS

Response to Office Action dated Aug. 10, 2011; for U.S. Appl. No. 12/371,857; 8 pages.

Notice of Allowance dated Oct. 31, 2011; for U.S. Appl. No. 12/371,857; 5 pages.

International Search Report of the ISA for PCT/US2012/048077 dated Oct. 11, 2012.

Written Opinion of the ISA for PCT/US2012/048077 dated Oct. 11, 2012.

DeLisio et al.; "Quasi-Optical and Spatial Power Combining;" IEEE Transactions on Microwave Theory and Techniques, vol. 50, No. 3; Mar. 2002; pp. 929-936.

Harvey et al.; Spatial Power Combining for High-Power Transmitters; Microwave;; IEEE Microwave Magazine, vol. 1, Issue 4; Dec. 2000; pp. 48-59.

Jia et al.; Design of Waveguide Finline Arrays for Spatial Power Combining; IEEE Transactions on Microwave Theory and Techniques, vol. 40, No. 4; Apr. 2001; pp. 609-614.

Lee; Notch Antennas; NASA/TM-2004-213057; Glenn Research Center, Cleveland, OH; Jul. 2004; 28 pages.

Lee et al.; Fully Micromachined Finite-Ground Coplanar Line-to-Waveguide Transitions for W-Band Applications; IEEE Transactions on Microwave Theory and Techniques, vol. 52, No. 3; Mar. 2004; pp. 1001-1007.

Li et al.; A Fully Micromachined W-Band Coplanar Waveguide to Rectangular Waveguide Transition;: Proceedings of IEEE/MIT-S International Microwave Symposium, Jun. 3-8, 2007; pp. 1031-1034.

Lin et al.; CPW to Waveguide Transition with Tapered Slotline Probe; IEEE Microwave and Wireless Components Letters, vol. 11, No. 7; Jul. 2001; pp. 314-316.

Lou et al.; "An In-Line Waveguide-to-Microstrip Transition Using Radial-Shaped Probe;" IEEE Microwave and Wireless Components Letters, vol. 18, No. 5; May 2008; pp. 311-313.

Mailloux; "Antenna Array Architecture;" Proceedings of the IEEE, vol. 80, No. 1; Jan. 1992; pp. 163-172.

Radiom et al.; "A Fully Micromachined W-band Waveguide-to-Grounded Coplanar Waveguide Transition for 91-113 GHz Applications;" Proceedings of the 40$^{th}$ European Microwave Conference; Sep. 28-30, 2010; pp. 668-670.

Radiom et al.; "An Effective Technique for Symmetric Planar Monopole Antenna Miniaturization;" IEEE Transactions on Antennas and Propragation, vol. 57, No. 10; Oct. 2000; pp. 2989-2996.

Seo et al.; "Via-Hole-Less Planar Microstrip-to-Waveguide Transition in Millimeter-Wave Band;" 2011 China-Japan Joint Microwave Conference Proceedings; Apr. 20-22, 2011; 4 sheets.

Simmons et al.; "New Coplanar Waveguide to Rectangular Waveguide End Launcher; " Electronics Letters, vol. 28, No. 12; Jun. 4, 1992; pp. 1138-1139.

Sowers et al.; "A 36W, V-Band Solid State Source;" IEEE MIT-S Digest; Jan. 1999; pp. 235-238.

Vahabisani et al.; "A New Waver-level CPW to Waveguide Transition for Millimeter-wave Applications;" 2011 IEEE International Symposium on Antennas and Propagation; Jul. 2-8, 2011; p. 869-872.

PCT International Search Report dated Nov. 24, 2011; for PCT Pat. App. No. PCT/US2010/047576; 3 sheets.

* cited by examiner

HIGH FREQUENCY, HIGH BANDWIDTH, LOW LOSS MICROSTRIP TO WAVEGUIDE TRANSITION

BACKGROUND

This disclosure relates to microwave and millimeter wave circuits and particularly to transitions for coupling signals between microstrip and waveguide transmission lines.

Microwave and millimeter wave circuits may use a combination of rectangular and/or circular waveguides and planar transmission lines such as stripline, microstrip, and co-planar waveguides. Waveguides are commonly used, for example, in antenna feed networks. Microwave circuit modules typically use microstrip transmission lines to interconnect microwave integrated circuit and semiconductor devices mounted on planar substrates. Transition devices are used to couple signals between microstrip transmission lines and waveguides.

Compact, highly-integrated radio frequency (RF) assemblies include, among other things, a power amplifier, a wirebond transition to a circuit board microstrip conductor, a second transition to a radiating element (such as a probe or printed antenna), and a thermal control substrate (such as a heat spreader). The components convey RF energy from the power amplifier (PA) to the radiating element. In turn, the radiating element may couple the RF energy to an output waveguide. The waste heat from the components (especially the PA) is controlled and redirected by the heat spreader in order to prevent degradation and/or premature failure of the electronics.

Traditional methods of employing heat spreaders in such assemblies often use individual heat spreaders under each microwave integrated circuit, chip, or other electronics in the assembly, a wirebond transition to microstrip, and then another transition to a radiating element. These transitions are somewhat fragile and prone to de-tuning from mechanical shocks. They are also labor-intensive to fabricate correctly and thus costly. Furthermore, such transitions can be very frequency-sensitive, thus limiting the utility of a particular transition design to a narrow range of either center frequency or bandwidth. In particular, standard transition techniques used at low frequency do not work well in high frequency applications because the transition has more loss and less bandwidth due to the tuned length of the microstrip transition in the circuit board.

Other transition methods known in the related arts include circuit E-probe, post E-Probe, and patch antenna transitions. Some prior art patch antenna transitions are described below with reference to FIGS. 1 and 2.

A prior art circuit E-probe transition is a fully micro-machined, finite ground, coplanar line-to-waveguide transition. The E-probe injects the transmit signal into a micro-machined slot, resulting in an E-field. The E-field then propagates into the waveguide. Such circuit E-probe transitions are described in, for example, Yongshik Lee, et al., Fully Micromachined Finite-Ground Coplanar Line-to-Waveguide Transitions for W-Band Applications, IEEE Trans. on Microwave Theory and Techniques, Vol. 52, No. 3, March 2004, p. 1001-1007.

In a prior art post E-probe transition to a rectangular waveguide, a co-planar waveguide (CPW) port is coupled to a post, which is located within a cavity formed on a quartz substrate. The cavity is typically formed of multiple, stacked layers of silicon. Electromagnetic energy injected at the CPW port causes the formation of an E-field in the cavity, which then couples through the waveguide port and thence down the waveguide (not shown). Such Post E-probe transitions are described in, for example, Yuan Li, et al., A Fully Micromachined W-Band Coplanar Waveguide to Rectangular Waveguide Transition, Proc. of IEEE/MTT-S International Microwave Symposium, 3-8 Jun. 2007, p. 1031-1034. Another implementation of a post E-probe transition is described in Nahid Vahabisani, et al., A New Wafer-level CPW to Waveguide Transition for Millimeter-wave Applications, 2011 IEEE International Symposium on Antennas and Propagation (APSURSI), 3-8 Jul. 2011, p. 869-872.

FIG. 1 depicts a prior art, fully micro-machined, W-band waveguide-to-grounded coplanar waveguide transition for 91-113 GHz applications 300. This transition utilizes via holes 310 to couple energy from port 320 to waveguide 330. Such transitions are typically used with patch antennas. This design is further described in Soheil Radiom, et al., A Fully Micromachined W-band Waveguide-to-Grounded Coplanar Waveguide Transition for 91-113 GHz applications, Proc. of the 40th European Microwave Conference, 28-30 Sep. 2010, p. 668-670.

FIG. 2 depicts another prior art transition used in patch antennas. This prior art transition 400 does not use via holes, but instead employs a microstrip 405, probe 410, and a patch element 420 (with surrounding ground plane 425) to couple energy into waveguide 430. Patch element 420 is formed on substrate 440. This design is further described in Kazuyuki Seo, et al., Via-Hole-Less Planar Microstrip-to-Waveguide Transition in Millimeter-Wave Band, 2011 China-Japan Joint Microwave Conference Proceedings (CJMW), 20-22 Apr. 2011, pp. 1-4.

Raytheon Company has previously designed a similar printed antenna transition addressing some of the same issues, as illustrated in FIG. 3. Printed circuit antenna 510 is provided on substrate 520 and connected to a transmitter (such as a power amplifier, not shown) located on pad 530 by a printed circuit trace 540. Energy is coupled to a waveguide (not shown) by means of via holes 550 in substrate 520. Antenna 510 is a quarter-circle or half-Vivaldi antenna, itself well-known in the art. This design is further described in U.S. Published Applications US2011/0102284 and US2010/0210225, incorporated herein by reference in their entireties.

In order to reduce losses, it is therefore desirable to minimize the use of transitions in coupling the energy from the PA to the waveguide, while at the same time providing a coupling scheme capable of operation and scalability over a wide range of operating center frequencies and bandwidths.

SUMMARY

In contrast to the above-described conventional approaches, embodiments of the invention are directed toward an integrated antenna/heat spreader that solves the problem of high losses that can occur due to lengthy microstrip transmission line transitions into waveguide.

In accordance with the concepts, systems, and techniques described herein, an antenna may be integrated with a heat spreader in a microwave integrated circuit assembly. In some embodiments, the interconnection between the antenna and the output device of integrated circuit assembly (for example, a power amplifier, or PA) may be a simple and short wirebond. This transition is low loss because it is short, but also because it does not pass RF energy through a dielectric as in a microstrip transmission line.

Previous (i.e. conventional) designs have transitioned from a PA to a circuit board microstrip and then to a radiating element. Such a transition has more loss and narrower bandwidth due to the tuned length of the microstrip transition in the circuit board and the loss of RF energy in the microstrip transmission line's dielectric. Also, traditional methods involve placing individual heat spreaders under each chip, complicating the assembly of multiple-channel assemblies.

Exemplary embodiments of the present apparatus and methods, which utilize the concepts described herein, eliminate the loss associated with one of these wirebond transitions and the loss in the microstrip transition printed circuit. Also, the transition and technique described herein can be easily scaled for both higher and lower frequencies. The device can be fabricated on a wide variety of materials and a wide range of thicknesses.

Integrating the antenna with the heat spreader in accordance with the concepts, circuits, and techniques described herein drastically shortens the distance from the output of the PA to the waveguide. This is very important at high frequencies because long distances between the PA and the waveguide cause a significant impedance mismatch in the transition. Integrating the antenna and heat spreader reduces the distance, thus reducing loss and increasing bandwidth.

Furthermore, embodiments of the present apparatus also eliminate the complexity of the prior art microstrip transmission line, circuit boards, and probe transitions and enable the use of a wider range of substrate options. And, even more importantly, the present apparatus and methods greatly simplify assembly of a monolithic microwave integrated circuit to a waveguide structure.

In accordance with a further aspect of the concepts describe herein, an integrated antenna/heat spreader apparatus includes a heat spreader having a first portion and a second portion, an antenna formed from the first portion of said heat spreader, a component mounted on the second portion of said heat spreader with the second portion of said heat spreader spaced apart by a gap from said antenna, one or more conductive connections disposed across the gap to connect said component to said antenna and a waveguide disposed over said antenna, wherein said one or more conductive connections, said gap, and said antenna are configured to radiate energy into an open end of said waveguide.

With this particular arrangement, an apparatus that drastically shortens the distance from the output of the circuit component to the waveguide is provided. This is very important at high frequencies because long distances between the circuit component (e.g. an RF power amplifier) and the waveguide cause a significant impedance mismatch in the transition. Integrating the antenna and heat spreader reduces the distance, thus reducing loss and increasing bandwidth. In one embodiment, the antenna is provided as a half-notch antenna.

In accordance with a still further aspect of the concepts describe herein, a microwave integrated circuit assembly includes a thermally conductive substrate having a first surface adapted to support one or more heat generating devices and having a side with a shape which forms an array of antenna elements, a plurality of heat generating components disposed on the first surface of said thermally conductive substrate and one or more electrically conductive connections between respective ones of said array of antenna elements and said plurality of heat generating components.

With this particular arrangement, a microwave integrated circuit assembly having increased thermal performance is provided. In this embodiment, in which the heat generating devices correspond to RF circuits, the assembly also operates with lower RF losses.

In one embodiment the microwave integrated circuit assembly further includes a plurality of waveguide transmission lines, each of which is disposed such that a respective one of the antenna elements which make up said array of antenna elements is positioned inside a respective one of the plurality of waveguide transmission lines.

In one embodiment, each of said one or more electrically conductive connections comprises one or more bond wires. Each of the one or more bond wires has a first end coupled to at least one antenna element which comprises the array of antenna elements and at least one of the plurality of heat generating devices. In one embodiment, in addition to the bond wires, each of the one or more electrically conductive connections further includes a planar transmission line coupled between one end of the bond wires and the heat generating devices.

In one embodiment, the shape of each of the antenna elements in the array of antenna elements is a generally fin-shape having a first side with a first portion coupled to the side of the thermally conductive substrate from which the fin-shape antenna element projects and a second portion having a gap between a side of the antenna element and the side of the thermally conductive substrate from which the fin-shape antenna element projects.

In accordance with a still further aspect of the concepts describe herein, a method of guiding radio frequency (RF) energy includes coupling RF energy to an input of an RF device disposed on a first surface of a heat spreader, coupling RF energy from an input of the RF device to an antenna element formed from a portion of the heat spreader and emitting RF energy from the antenna element formed from a portion of the heat spreader.

In one embodiment, emitting RF energy from the antenna element formed from a portion of the heat spreader includes emitting RF energy from the antenna element formed into a first end of a waveguide and the method further includes emitting RF energy from the waveguide.

In accordance with a still further aspect of the concepts describe herein, a method of manufacturing an RF system, includes providing a heat spreader having a first portion and a second portion, forming an antenna from said first portion of said heat spreader, wherein said second portion of said heat spreader is spaced apart by a gap from part of the first portion of said heat spreader which forms said antenna element, mounting a component on said second portion of said heat spreader, connecting said component with one or more conductive connections disposed across the gap and fixedly positioning a waveguide over said antenna, wherein said one or more conductive connections, said gap, and said antenna are configured to radiate energy into an open end of said waveguide.

In one embodiment, the open end of said waveguide is fixedly positioned perpendicular to a plane containing said heat spreader, said antenna, and said gap. In one embodiment, the antenna is a half-notch antenna. In one embodiment, the antenna is fixedly positioned substantially in the center of said waveguide both horizontally and vertically. In one embodiment, the head spreader is comprised of a thermally and electrically conductive material.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Figure 1:
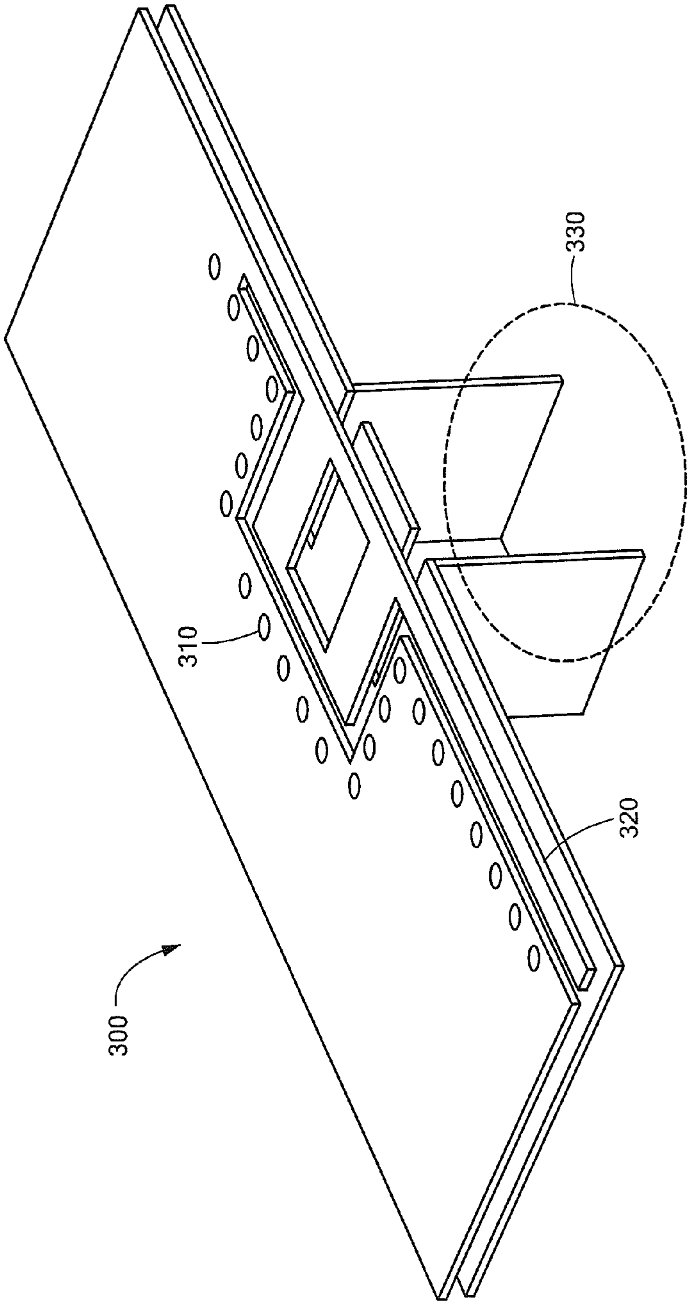
PRIOR ART FIG. 1
FIG. 1 is an isometric view of one type of a patch antenna transition, as known in the prior art.
Figure 2:
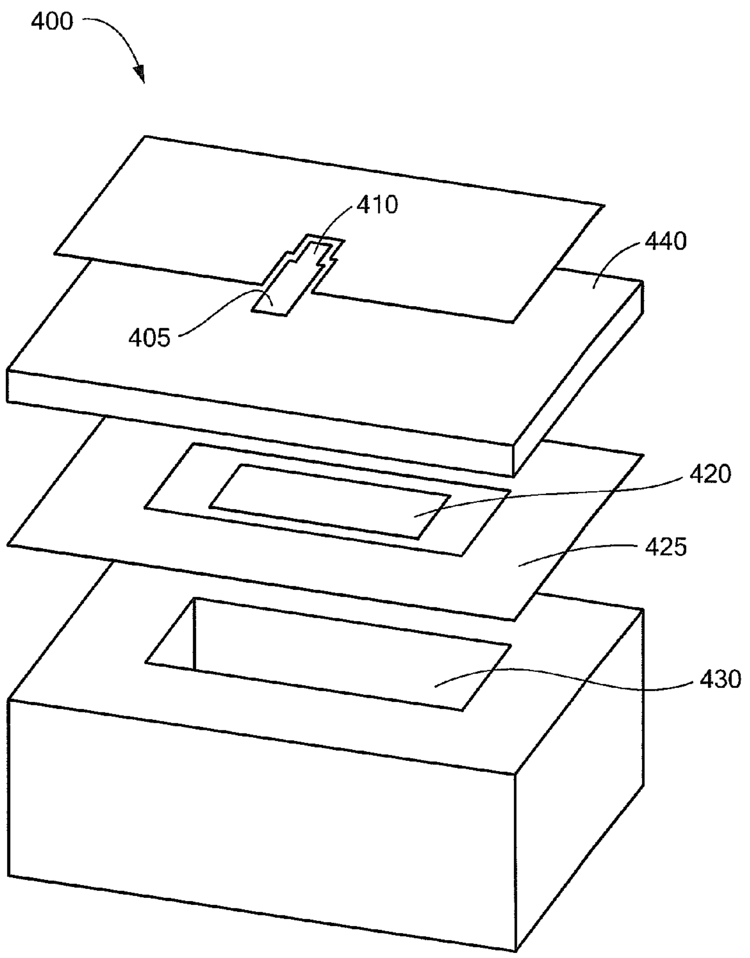
PRIOR ART FIG. 2
FIG. 2 is an isometric view of another type of a patch antenna transition, as known in the prior art.

In this patent, the term "waveguide" is defined as an electrically conductive pipe having a wholly or partially dielectric-filled, or preferably a hollow, interior passage for guiding an electromagnetic wave. The cross-sectional shape, normal to the direction of propagation, of the interior passage may commonly be rectangular or circular, but may also be square, oval, or an arbitrary shape adapted for guiding an electromagnetic wave. The term "planar transmission line" means any transmission line structure formed on a planar substrate. Planar transmission lines may include (without limitation) strip-lines, microstrip lines, coplanar lines, slot lines, and other structures capable of guiding an electromagnetic wave.

The relative position of various elements of a planar transmission line to waveguide transition, as shown in the drawings, may be described using geometric terms such as top, bottom, above, below, left and right. These terms are relative to the drawing view under discussion and do not imply any absolute orientation of the planar transmission line to waveguide transition. Similarly, references to vertical or horizontal electric or magnetic field orientations are also relative.

Presently disclosed are embodiments of a novel, integrated antenna/heat spreader apparatus, as shown and described below with regard to FIGS. 4, 5, and 6.

Figure 4:
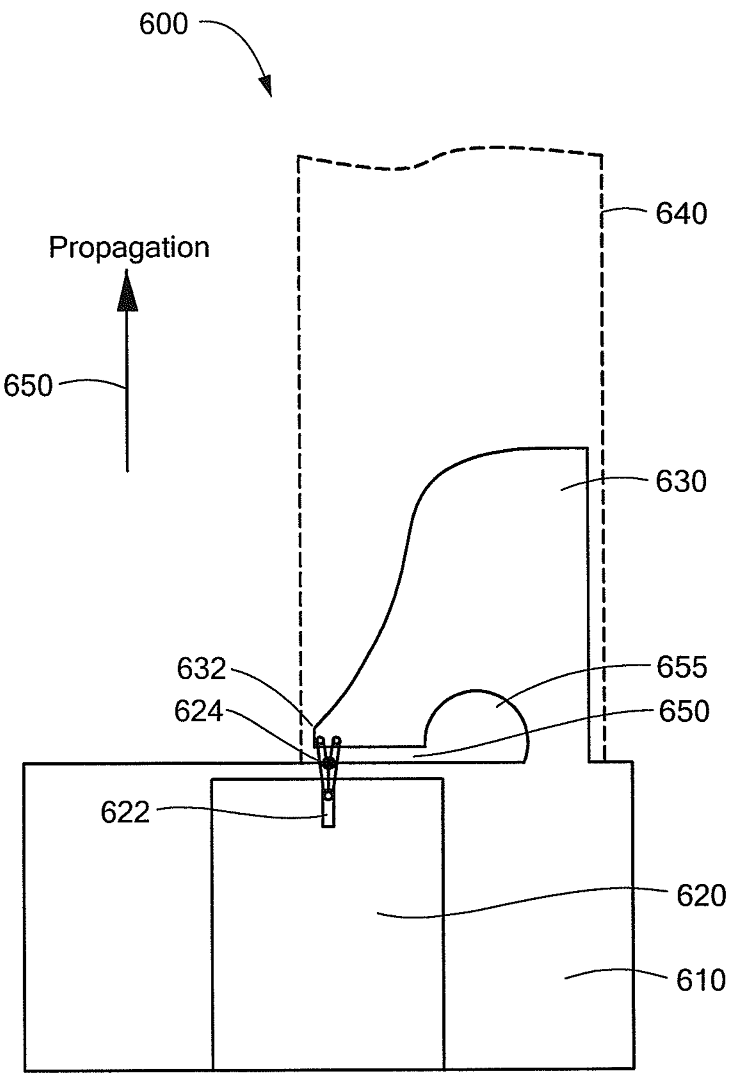
FIG. 4 is a plan view of a portion of a microwave integrated circuit assembly that includes a heat spreader-integrated antenna.

FIG. 4 illustrates a plan view of one exemplary embodiment of a microwave integrated circuit assembly that includes a waveguide transition constructed in accordance with the concepts, circuits and techniques described herein. This view is looking down onto the plane of a heat spreading substrate 610 (i.e., looking down onto a top surface of heat spreading substrate 610). Typically, such a heat spreader 610 is substantially planar and is constructed of a rigid conductive material, including (without limitation) silver, aluminum, copper, and alloys and/or composites thereof. One of ordinary skill in these arts will readily appreciate that many materials or composites thereof may be used as heat spreaders, including (without limitation) composite materials containing diamond or other forms of carbon in addition to copper, aluminum, or silver. Such composites may be designed to enhance thermal conductivity or to constrain thermal expansion to match that of other materials bonded thereto. Accordingly, the present apparatus and techniques are not limited to the use of any particular heat spreading material.

Furthermore, the application of the present techniques and implementation of the present apparatus is not limited to planar heat spreaders, nor to heat spreader/substrate materials that are metallic or rigid. One of ordinary skill in the art will readily appreciate that any thermally and electrically conductive material may be employed for the heat spreader and that such material may take any shape.

Mounted on a portion of heat spreader 610 may be, for example, a power amplifier or other component 620 (without limitation), including a plurality of components 620. Antenna 630 is formed as part of (or as a portion of) substrate 610. Because substrate 610 acts as a heat spreader for component 620, antenna 630 also acts as a heat spreader. Indeed, the substrate 610/antenna 630 combination defines the heat spreader. Put differently, antenna 630 forms a portion of heat spreader 610.

In some exemplary embodiments, antenna 630 is a half-notch antenna although any type of printed circuit antenna may, of course, be used. Antenna 630 projects into an end of waveguide 640. It should be appreciated that portions of waveguide 640 have been removed so as to reveal antenna 630 in FIG. 4. In this orientation, the direction of propagation of the RF signals along the length of waveguide 640 is shown by arrow 650, parallel to the plane defined by heat spreader 610/antenna 630. Thus, the open end (or, conventionally, the cross-section) of waveguide 640 is perpendicular to the plane containing heat spreader 610.

In one exemplary embodiment, component 620 comprises a microstrip transmission line element 622 operably coupled to an output terminal of a device (for example, but not by way of limitation, a power amplifier integrated circuit) by conventional means. Preferably, microstrip transmission line element 622 may be replaced by a simple conductor to further eliminate losses. The opposite (distal) end of microstrip (or conductor) 622 is connected by one or more conventional conductive connections 624 to antenna 630 across gap region 650. Components 620, conductive connections 624, and the method of connecting same to each other and to antenna 630 may be conventional devices and/or techniques well known in the art. For example, but not by way of limitation, conductive connections 624 may be accomplished by any metallic interconnection well-known means in the art such as a wirebond (also known as bond wires), printed circuit or similar direct write circuit, straps, etc., without limitation.

The size and shape of antenna 630 and gap region 650 may be determined in a number of ways, but the goal is to provide a "smooth" transition (i.e. provide a transition having a reduced number and/or size of any discontinuities) for the RF energy (via microstrip transmission line/conductor 622 from component 620) as it propagates into waveguide 640. The one or more conductive connections 624 over gap 650 excite a field in the gap region. This energy can then travel in either direction (i.e., left or right, relative to the conductive connections shown in FIG. 4). The length of gap 650 and the size of the circular cutout 655 at the end of it are optimized to ensure the energy traveling in this direction is reflected back in phase with the energy traveling the opposite direction. This causes a recombination of power at corner 632 of the antenna. This energy then travels around corner 632, and between the antenna and edge of the waveguide. As this gap between the edge of antenna 630 and the inside wall of waveguide 640 grows, the proper E-field is set up in the waveguide, thus enabling transmission of the RF energy into the open end of waveguide 640. The shaped contour of the antenna fin relative to the waveguide is optimized by conventional modeling and simulation tools (discussed below) for maximum transmission.

One purpose of such an antenna is to convert the E-field orientation from the microstrip orientation to the waveguide orientation (e.g. to "twist" the E-field from the microstrip "vertical" orientation to the waveguide "horizontal" orientation). While the foregoing antenna bears some resemblance to the conventional Vivaldi antenna described in, for example, U.S. Pat. No. 6,043,785, Broadband Fixed-Radius Slot Antenna Arrangement, issued to Ronald A. Marino, Mar. 28, 2000, the presently-described antenna configuration is unique because it is both formed from the heat spreader and uses the edge of the waveguide as the second half of the transition.

The traditional Vivaldi antenna, by contrast, typically requires the use of fins to achieve the transition from a planar transmission line to a waveguide transmission line. Furthermore, the Vivaldi design, in all its various forms, each well known in the art, generally requires a supported dielectric for the microstrip transition.

In a preferred embodiment, the structure and technique described herein completely eliminates the dielectric material of microstrip transmission line/conductor 622 and replaces it with air. Elimination of the transmission line and its associated losses also increases bandwidth.

Antenna 630 may be designed and simulated using a conventional software tool adapted to solve three-dimensional electromagnetic field problems. The software tool may be a commercially available electromagnetic field analysis tool such as CST Microwave Studio™, Agilent's Momentum™ tool, or Ansoft's HFSS™ tool. (All trademarks are the property of their respective owners.) The electromagnetic field analysis tool may be a proprietary tool using any known mathematical method, such as finite difference time domain analysis, finite element method, boundary element method, method of moments, or other methods for solving electromagnetic field problems. The software tool may include a capability to iteratively optimize a design to meet predetermined performance targets. The example of FIGS. 4-6 may provide a starting point for the design of planar transmission line (or microstrip) to waveguide transitions for other wavelengths and/or other waveguide shapes.

Although a design for certain planar waveguide transitions featuring an integrated antenna/heat spreader are described, those skilled in the art will realize that design configurations, including but not limited to antenna size, shape, and gap configurations other than those depicted, can be used. Accordingly, the concepts, systems, and techniques described herein are not limited to any particular antenna and/or gap configuration, frequency band, operating frequency, or bandwidth. Optimization of the present invention's parameters to the performance dictates of different center frequency and bandwidth requirements is well within the skill of one of ordinary skill in the relevant arts.

Figure 5:
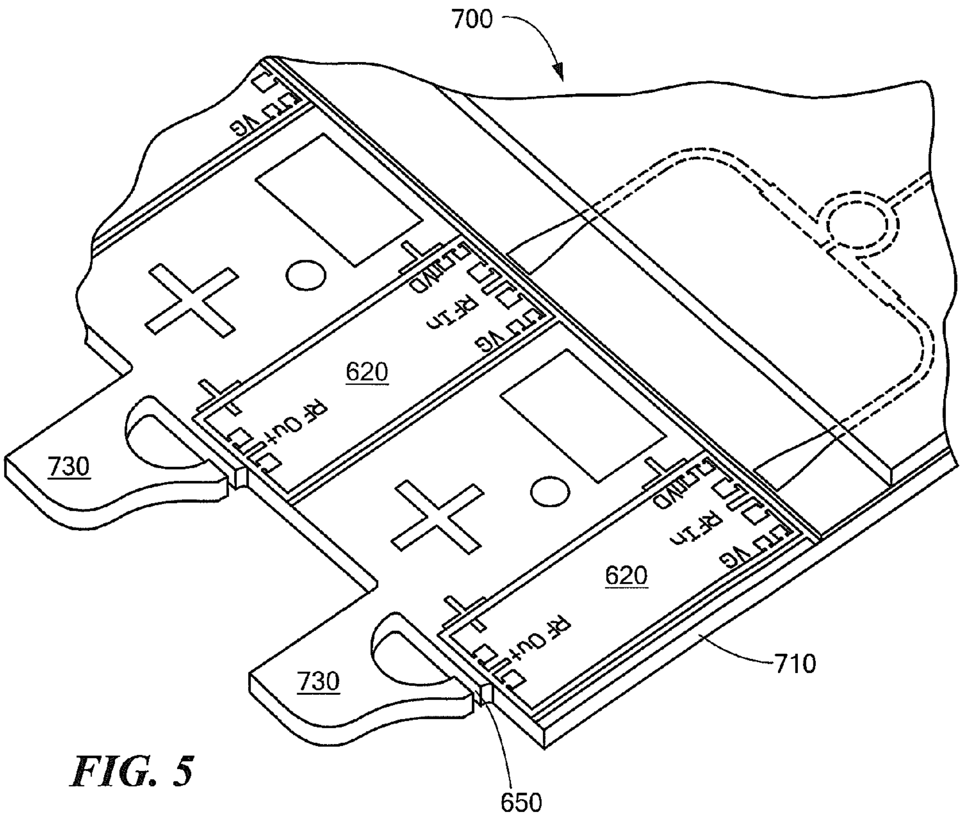
FIG. 5 is an isometric view of a portion of a microwave integrated circuit assembly that includes a heat spreader-integrated antenna.

FIG. 5 depicts an alternate embodiment of an exemplary microwave integrated circuit assembly 700. In this exemplary embodiment, an array of integrated heat spreader antenna elements 730 are formed from a side of thermally conductive substrate 710. Each of the integrated heat spreader antenna elements 730 provide a transition from a respective one of heat generating devices 620 (here shown as RF circuits such as power amplifier circuits) to a waveguide (not shown in FIG. 5). Thus, microwave integrated circuit assembly 700 includes multiple transitions (in multiple communications channels, for example) on a common thermally conductive substrate 710.

Here, all of the antenna elements 730 are formed as part of the same common heat spreader (or substrate) 710. Although waveguides 640 (FIG. 4), conductors 622 (FIG. 4), and conductive connections 624 (FIG. 4) are omitted from FIG. 5 for clarity of illustration, it should be appreciated that each antenna 730 is disposed within a waveguide.

It should also be appreciated that microwave integrated circuit assembly 700 also includes a power divider, which couples RF energy to the RF inputs of RF devices 620. One or more bond wires may be used to couple power divider outputs to respective ones of the RF inputs of RF devices 620. Other techniques may, of course, also be used. RF outputs of RF devices 620 are each coupled (e.g., but not by way of limitation, via one or more a bond wires) to respective ones of the integrated heat spreader antenna elements 730 as discussed above in conjunction with FIG. 4.

Figure 6:
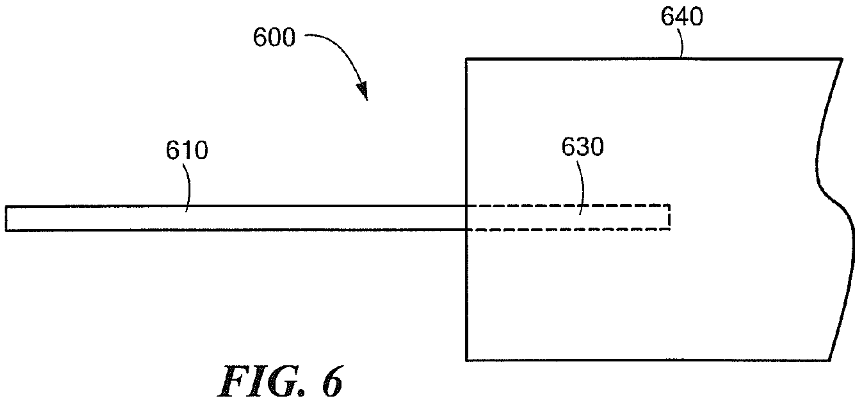
FIG. 6 is a side view of the microwave integrated circuit assembly of FIG. 4, showing a position of the antenna within a waveguide.

FIG. 6 shows an exemplary embodiment of transition apparatus 600 in a side view. Substrate 610 is here depicted in section to show its relative position within waveguide 640. Antenna 630 is completely within waveguide 640 and is ideally placed in the center of waveguide 640 both vertically and horizontally. Antenna placement does impact performance optimization. For example, an antenna designed to be in the center will not work well if it is moved up 10-20 mils (one mil=0.001"=one thousandth of an inch) because of the taper of the E-field in the waveguide. (The E-field is the strongest in the center, and tapers off to zero at the edges.) This causes the placement of the antenna to be critical relative to what position within the waveguide it was optimized to in the design phase.

The side-to-side waveguide placement relative to the antenna is also critical, but for a different reason. The thickness of the antenna plays a role in the sensitivity. The thicker the antenna, the higher the capacitance between the antenna and the edge of the waveguide. This capacitance is part of the tuning of the antenna, and as the gap is changed (moved side-to-side), the center frequency of the antenna shifts. The larger the nominal gap to the waveguide edge, the better (to a point). The thinner the antenna, the less sensitive to side-to-side positioning it will be.

A side-to-side gap of 1 to 3 mils (0.001-0.003 inches) between the antenna and the interior surface of the waveguide is preferable. Because there are several factors in the design (mentioned above), the exact dimensions will depend on performance requirements and the thickness of the antenna. The thinner the antenna, the less capacitance between it and the wall, and thus less sensitivity to side-to-side placement. The thickness of the antenna does not affect the vertical position in the waveguide. Either of these designs could be implemented at higher and lower frequencies.

Figure 3:
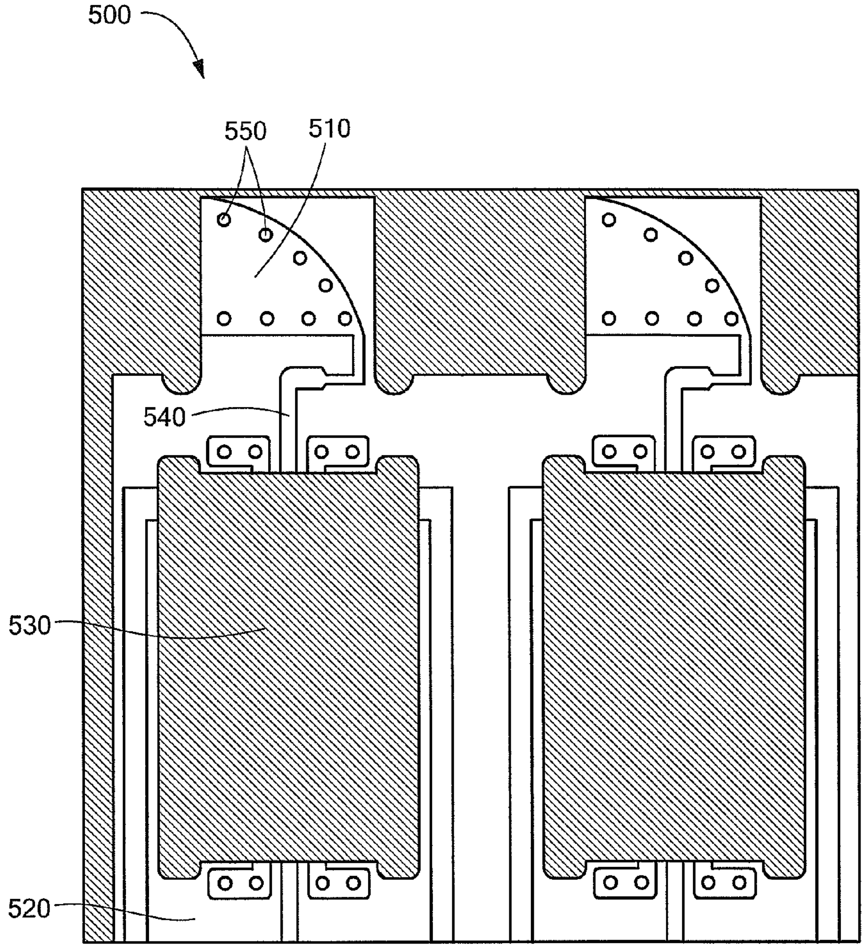
PRIOR ART FIG. 3
FIG. 3 is a plan view of a printed antenna transition, as known in the prior art.

Experimental prototyping has shown that W-band embodiments of the above-described apparatus perform better than any microstrip to waveguide transition the inventors have been able to find in literature. It has very low loss and great bandwidth performance. In one particular exemplary embodiment prototyped and tested, the prior art printed antenna design of FIG. 3 had an average loss of 0.5 dB and its measured bandwidth was 5%. By contrast, a prototype of the new apparatus described herein had an average loss of 0.25 dB, and exhibited a measured bandwidth of ~10% or greater. The loss and BW of the prior art design of FIG. 3 were hindered mostly by the microstrip transmission line 540 feeding antenna 510, as it is a tuning feature of the antenna 510.

While particular embodiments of the present invention have been shown and described, it will be apparent to those skilled in the art that various changes and modifications in form and details may be made therein without departing from the spirit and scope of the invention as defined by the following claims. Accordingly, the appended claims encompass within their scope all such changes and modifications.

We claim:

1. An integrated antenna/heat spreader apparatus comprising:

a heat spreader having a first portion and a second portion;

an antenna formed from the first portion of said heat spreader;

a component mounted on the second portion of said heat spreader with the second portion of said heat spreader spaced apart by a gap from said antenna;

one or more conductive connections disposed across the gap to connect said component to said antenna; and a waveguide disposed over said antenna, wherein said one or more conductive connections, said gap, and said antenna are configured to radiate energy into an open end of said waveguide.

2. The apparatus of claim 1, wherein the open end of said waveguide is disposed perpendicular to a plane containing said heat spreader, said antenna, and said gap.

3. The apparatus of claim 1, wherein said antenna is a half-notch antenna.

4. The apparatus of claim 1, wherein said antenna is disposed substantially in the center of said waveguide both horizontally and vertically.

5. The apparatus of claim 1, wherein the gap between said antenna and said waveguide is about 0.001 to 0.003 inches.

6. The apparatus of claim 1, wherein said head spreader is comprised of a thermally and electrically conductive material.

7. The apparatus of claim 6, wherein said head spreader material further comprises an alloy.

8. The apparatus of claim 6, wherein said head spreader material further comprises a composite material.

9. The apparatus of claim 6, wherein said head spreader material further comprises a composite material comprising at least one alloy.

10. The apparatus of claim 6, wherein said head spreader material further comprises a material selected from a group consisting essentially of silver, aluminum, and copper.

11. The apparatus of claim 1, wherein said heat spreader is substantially planar.

12. The apparatus of claim 1, wherein said one or more conductive connections comprises a bond wire.

13. A microwave integrated circuit assembly comprising:

a thermally conductive substrate having a first surface adapted to support one or more heat generating components and having a side with a shape which forms an array of antenna elements;

a plurality of heat generating components disposed on the first surface of said thermally conductive substrate; and one or more electrically conductive connections between respective ones of said array of antenna elements and said plurality of heat generating components, wherein said array of antenna elements includes at least one element that is at least partially separated from a main portion of the thermally conductive substrate by a gap and the one or more electrically conductive connections includes at least one transmission line section that spans said gap.

14. The microwave integrated circuit assembly of claim 13 wherein said plurality of heat generating components correspond to electrical circuit components.

15. The microwave integrated circuit assembly of claim 13 further comprising a plurality of waveguide transmission lines, each of said waveguide transmission lines disposed such that a respective one of the antenna elements which make up said array of antenna elements is disposed inside have a respective one of said plurality of waveguide transmission, lines.

16. The microwave integrated circuit assembly of claim 15 wherein said plurality of waveguide transmission lines and said plurality of heat generating components are like pluralities.

17. The microwave integrated circuit assembly of claim 13 wherein each of said one or more electrically conductive connections comprises one or more bond wires with each of said one or more bond wires having a first end coupled to at least one antenna element which comprises the array of antenna elements and having a second end coupled to at least one of said plurality of heat generating components.

18. The microwave integrated circuit assembly of claim 17 wherein each of said one or more electrically conductive connections further comprises a planar transmission line coupled between one end of said bond wires and said heat generating devices.

19. The microwave integrated circuit assembly of claim 13 wherein the shape of each of the antenna elements in said array of antenna elements is a generally fin-shape having a first side with a first portion coupled to the side of said thermally conductive substrate from which said fin-shape antenna element projects and a second portion having a gap between a side of the antenna element and the side of said thermally conductive substrate from which said fin-shape antenna element projects.

20. A method of guiding radio frequency (RF) energy comprising:

coupling RF energy to an input of an RF device disposed on a first surface of a heat spreader;

coupling RF energy from an output of the RF device to an antenna element formed from a portion of the heat spreader, wherein said antenna element is at least partially separated from a main portion of the heat spreader by a gap and coupling RF energy from the output of the RF device to the antenna element includes directing the RF energy through a conductive connection spanning said gap; and emitting RF energy from the antenna element formed from a portion of the heat spreader.

21. The method of claim 20 wherein emitting RF energy from the antenna element formed from a portion of the heat spreader comprises emitting RF energy from the antenna element formed from a portion of the heat spreader into a first end of a waveguide and the method further comprises emitting RF energy from the waveguide.

22. A method of manufacturing an RF system, comprising:

providing a heat spreader having a first portion and a second portion;

forming an antenna from said first portion of said heat spreader, wherein said second portion of said heat spreader is spaced apart by a gap from part of the first portion of said heat spreader which forms said antenna element;

mounting a component on said second portion of said heat spreader;

connecting said component with one or more conductive connections disposed across the gap; and fixedly positioning a waveguide over said antenna, wherein said one or more conductive connections, said gap, and said antenna are configured to radiate energy into an open end of said waveguide.

23. The method of claim 22, wherein the open end of said waveguide is fixedly positioned perpendicular to a plane containing said heat spreader, said antenna, and said gap.

24. The method of claim 22, wherein said antenna is a half-notch antenna.

25. The method of claim 22, wherein said antenna is fixedly positioned substantially in the center of said waveguide both horizontally and vertically.

26. The method of claim 22, wherein said head spreader is comprised of a thermally and electrically conductive material.

* * * * *